United States Patent
Onose et al.

(10) Patent No.: US 6,917,054 B2
(45) Date of Patent: Jul. 12, 2005

(54) SEMICONDUCTOR DEVICE

(75) Inventors: Hidekatsu Onose, Hitachi (JP); Hideo Homma, Toride (JP); Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/681,126

(22) Filed: Oct. 9, 2003

(65) Prior Publication Data

US 2004/0135178 A1 Jul. 15, 2004

(30) Foreign Application Priority Data

Oct. 10, 2002 (JP) ........................................ 2002-297026

(51) Int. Cl.⁷ ..................... H01L 31/0312; H01L 29/72
(52) U.S. Cl. ......................... 257/77; 257/136; 257/330
(58) Field of Search ........................ 257/77, 136, 256, 257/262, 263, 285, 401, 284, 328, 330, 623, 624

(56) References Cited

U.S. PATENT DOCUMENTS

| | | | | |
|---|---|---|---|---|
| 5,396,085 A | * | 3/1995 | Baliga | ........................ 257/77 |
| 5,747,831 A | * | 5/1998 | Loose et al. | ................... 257/77 |
| 5,753,938 A | * | 5/1998 | Thapar et al. | ................. 257/77 |
| 5,945,701 A | * | 8/1999 | Siergiej et al. | ............. 257/285 |
| 6,380,569 B1 | * | 4/2002 | Chang et al. | ................ 257/256 |
| 6,617,653 B1 | * | 9/2003 | Yokogawa et al. | ......... 257/379 |
| 6,767,783 B2 | * | 7/2004 | Casady et al. | .............. 438/234 |

FOREIGN PATENT DOCUMENTS

JP       2001-094120 A       4/2001

* cited by examiner

Primary Examiner—Craig A. Thompson
Assistant Examiner—Jennifer M Dolan
(74) Attorney, Agent, or Firm—Antonelli, Terry, Stout & Kraus, LLP

(57) ABSTRACT

A semiconductor device includes a trench formed on a source side of a drift region, a p-type gate region and a gate formed at the bottom of the trench, and the source formed over the entire surface of the unit device through an insulating film. The narrowest portion of a channel of the device is deeper than one-half the junction depth of the p-type gate region. This allows the width of the channel on the drain side to be reduced even when a lower energy ion implantation manufacturing process is used.

16 Claims, 7 Drawing Sheets

SEMICONDUCTOR DEVICE

BACKGROUND OF THE INVENTION

The present invention relates to improvements for transistors such as junction FETs (JFETs) and static induction transistors (SITs).

Silicon carbide (SiC) has about 10 times as high a dielectric breakdown field as silicon (Si), so that a drift region provided to maintain a blocking voltage can be made thin and highly concentrated, thus reducing losses. Power semiconductor devices using SiC include junction FETs (JFETs) and static induction transistors (SITs).

An example of an SIT that takes advantage of the features of SiC is described in JP-A-2001-94120. The structure in this Japanese patent has an $n^+$ drain region, an $n^-$ drift region, an $n^+$ source region, a p-type gate region and a $p^+$ contact region. It also has a drain electrode, a source electrode and a gate electrode.

SIT are transistors that turns an electric current on or off by a depletion layer expanding from the gate into a channel. By narrowing the channel width, which is equivalent to an interval between the p-type gate regions, a normally-off capability to maintain an off-state is realized even when a gate voltage is 0 V. The channel is an area between the p-type gate regions, and a thickness of the p-type gate regions represents a channel length. In the p-type gate region, the depletion layer spreading from the shallow contact region toward the $n^-$-type drift region is not involved in the current control. When an impurity concentration in the p-type gate regions on each side of the channel is low, since the depletion layer expands not only on the channel side but also in the p-type region, a drain voltage blocking effect is weak during the off-state. Therefore, the channel needs to be formed to have an extremely fine width to realize a high blocking voltage.

More specifically, let us consider a case of an SIT with a blocking voltage of several hundred volts. If the thickness of the p-type gate region or the channel length is about 0.5 μm, the channel width needs to be 0.3 μm or less to secure an on-state interruption capability. The p-type gate region requires a junction depth of about 1 μm. To obtain a junction of such a depth, ion implantation must be performed with a large acceleration energy. It is conceivable to use an energy as high as a MeV level in the ion implantation. Such a high energy ion implantation, however, requires a thick mask material for shielding, so that for a fine channel it is necessary to form a fine line with a large aspect ratio with a photolithography process, making the formation of fine channels more susceptible to process variations. If we take process variations to be ±0.05 μm, the on-state voltage and the blocking voltage are both susceptible to the effect of the process variations, resulting in characteristic variations including a desired blocking voltage failing to be produced or a current failing to flow even during the on-state due to a too narrow channel.

SUMMARY OF THE INVENTION

An object of this invention is to realize a semiconductor device with a reduced on-state resistance and an improved blocking effect, both achieved while using an ion implantation with a relatively low energy.

To enhance the gate blocking effect, it is effective to narrow a channel width. Suppressing an ingress of an electric field from the drain side is particularly important. It is therefore not necessary to narrow the width over the entire range in the channel depth direction. However, it is important that the channel width be made smaller on the drain side. Further, if the concentration of the p-type gate region is low, the potential barrier expanding from the p-type gate region will decrease even at a low drain voltage, eliminating the blocking effect.

In one aspect the present invention provides a semiconductor device which comprises a trench formed in a second plane of a drift region; a p-type gate region formed from a bottom of the trench into the drift region; a gate electrode formed in the gate region; and a source electrode formed over the gate electrode through an insulating film.

In another aspect the present invention provides a semiconductor device including: a substrate of a first conductivity type with a low impurity concentration and a band gap of 2.0 eV or higher; a first region formed in a first plane of the substrate and having the same conductivity type as and a lower resistance than the substrate; a first electrode formed in another plane of the first region; a second region formed in a second plane of the substrate and having the same conductivity type as the substrate; and a second electrode formed in the second region; the semiconductor device comprising: a trench formed in the second plane of the substrate; a control region formed from a bottom of the trench into the substrate and having a different conductivity type than that of the substrate; a control electrode formed in the control region; and the second electrode formed over the control electrode through an insulating film.

In still another aspect the present invention provides a semiconductor device including: an n-type drift region with a low impurity concentration and a band gap of 2.0 eV or higher; an n-type drain region formed in a first plane of the drift region and having a lower resistance than the drift region; a drain electrode formed in another plane of the drain region; an n-type source region formed in a second plane of the drift region; and a source electrode formed in the source region; the semiconductor device comprising: a trench formed in the second plane of the drift region; a p-type gate region formed from a bottom of the trench into the drift region; a gate electrode formed in the gate region; and the source electrode formed over the gate electrode through an insulating film.

As described above, in order to avoid a requirement of using a high-energy ion implantation, this invention forms a trench in the surface of the substrate on the source side and provides a p-type gate region and a gate electrode in at least the bottom of the trench. This allows the channel width on the drain side to be narrowed even with a low energy ion implantation, thus enhancing the blocking effect of the gate.

Further, by forming an insulating film on the gate electrode to form a source electrode over the entire surface of the unit device, it is possible to minimize an increase in the source electrode resistance even when the device pattern is microfine. This in turn realizes a further reduction in the on-state resistance.

Other objects, features and advantages of the invention will become apparent from the following description of the embodiments of the invention taken in conjunction with the accompanying drawings.

DETAILED DESCRIPTION OF THE EMBODIMENTS

Now, embodiments of the present invention will be described in detail by referring to the accompanying drawings.

Figure 1:
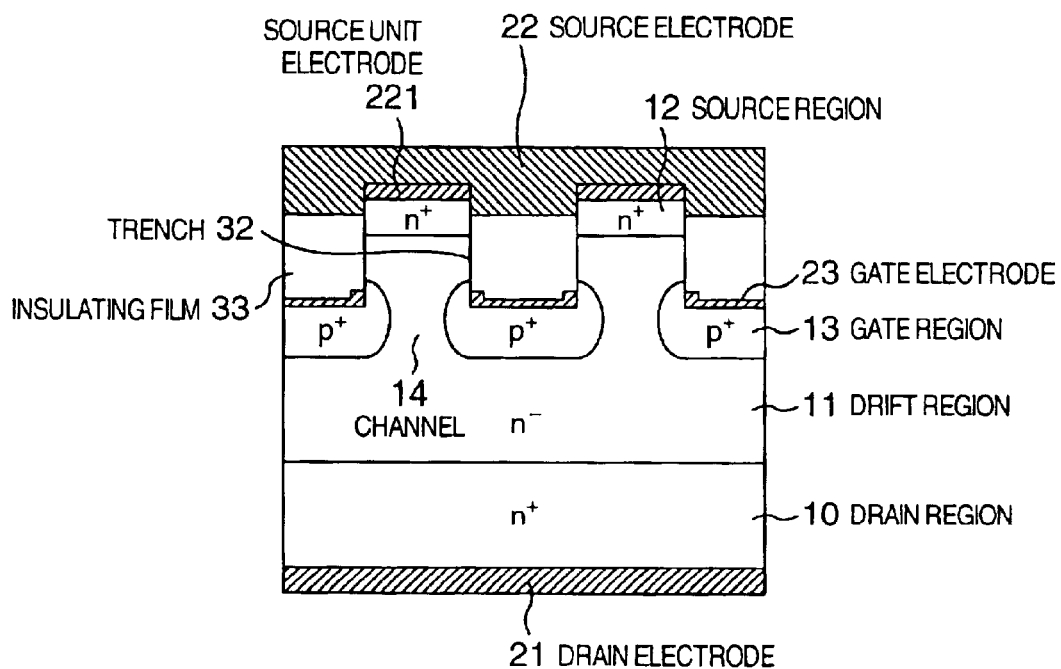
FIG. 1 is a cross-sectional view showing a structure of an SIT as a first embodiment of the present invention.

FIG. 1 is a cross-sectional view showing a structure of a SIT as a first embodiment of this invention. In the figure, numeral 11 denotes an n-type drift region, formed by a substrate of a first conductivity type with a low impurity concentration (which region will be referred to as either drift region 11 or substrate 11, hereinafter). An $n^+$ drain region 10 is a first region formed on a first plane of the n-type drift region (substrate) 11 which has the same conductivity type n as, and a lower resistance than the drift region 11. An n-type source region 12 is a second region formed on a second plane of the substrate 11 which has the same conduction type n as the substrate 11. Reference number 32 designates a trench formed in the second plane of the drift region (substrate) 11. Spreading from a bottom of this trench 32 into the substrate 11 is a gate region 13, which is a control region of a conductivity type p different from that of the substrate 11. Formed over this control region 13 is a gate (control electrode) 23, over which is formed a source 22 (second electrode) through an insulating film 33. Numeral 221 denotes a source (second unit electrode) and 21 a drain (first electrode).

In this embodiment, the source region 12 was formed over an entire function area of the device through an ion-implantation of nitrogen and then dry-etched to form the trench 32 to a depth of 1 μm deep. The bottom of the trench 32 was ion-implanted with aluminum with an acceleration energy of no more than 350 keV at maximum to form the p-type gate region 13. The interval between the trenches 32 (width of the $n^+$ source region 12) is 0.5 μm. As a result, a junction deeper than 1 μm can be formed without using as high an energy as 1 MeV.

Figure 2:
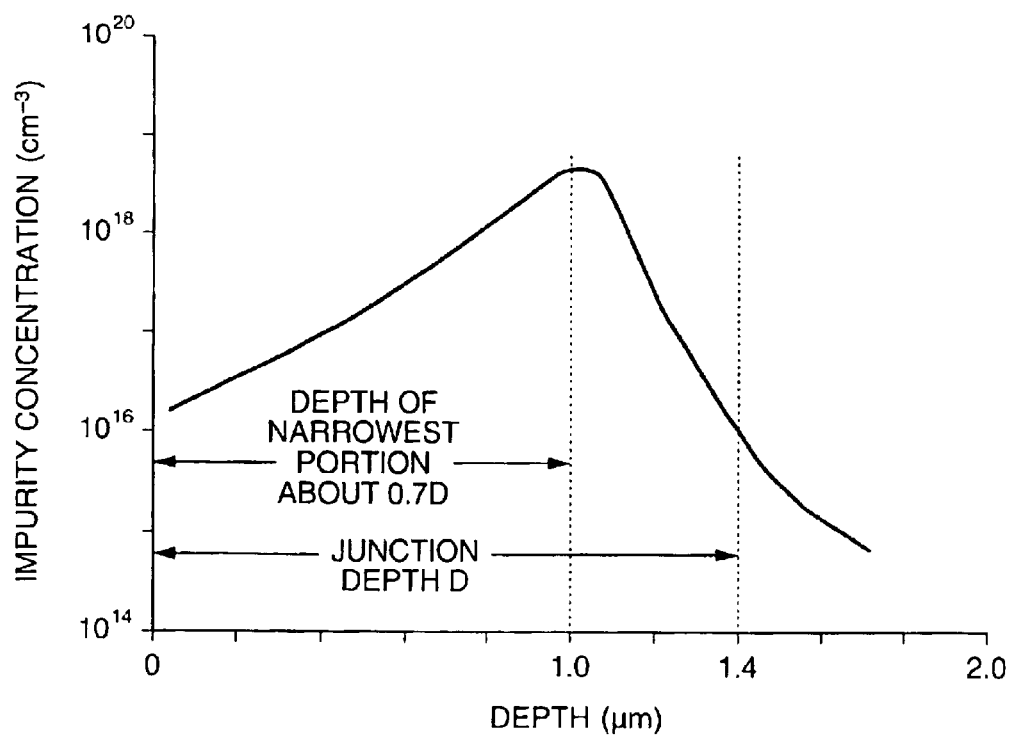
FIG. 2 is a graph showing an impurity concentration profile in the first embodiment of the invention.

FIG. 2 is an impurity concentration profile in the first embodiment used to explain the action of the present invention. A junction depth D is about 1.4 μm and a depth of a narrowest portion of the channel 14 is about 1 μm, approximately 70% of the junction depth D.

Figure 3:
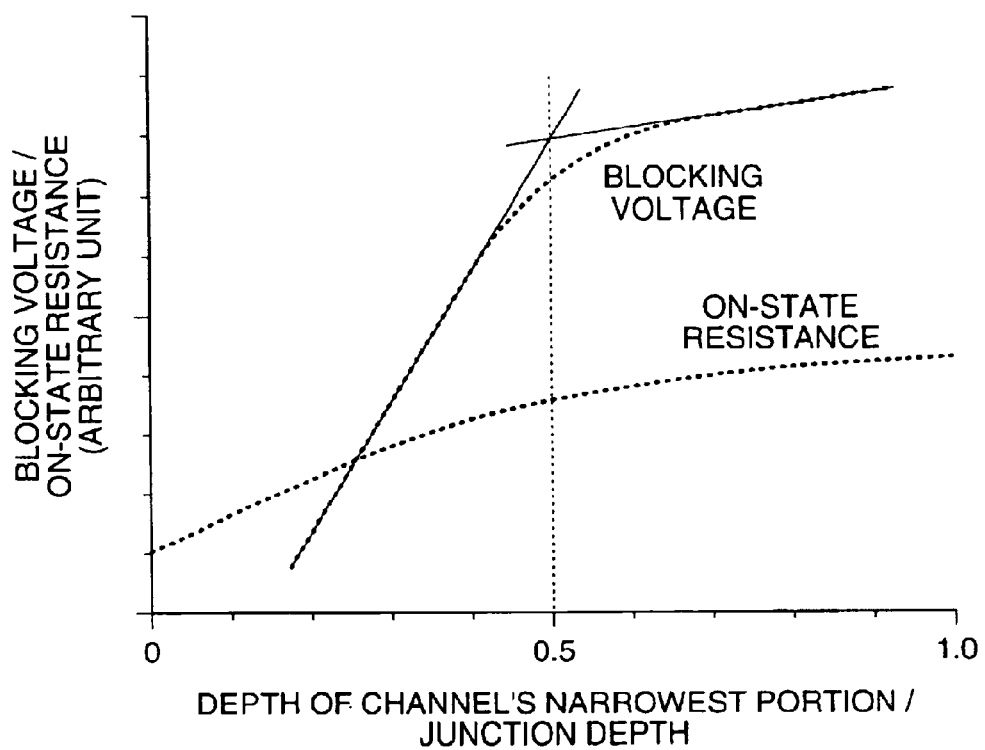
FIG. 3 is a graph showing a relation between a blocking voltage/on-state resistance and a channel's narrowest portion depth to junction depth ratio.

FIG. 3 shows a relation between measurements of blocking voltage/on-state resistance and a ratio of the channel's narrowest portion depth to junction depth. The blocking voltage sharply decreases as the depth ratio becomes smaller than 0.5. The dependence of on-state resistance on the depth ratio is not so large as that of the blocking voltage, and an increase of the on-state resistance is not conspicuous even when the depth ratio is larger than 0.5. Therefore, by making the depth of the channel's narrowest portion greater than one-half of the junction depth, the blocking performance can be improved without causing a significant increase in the on-state resistance.

In the first embodiment of this invention, as described above, the narrowest portion of the channel 14 has a depth of about 1 μm, which is about 70%, or sufficiently greater than one-half, of the junction depth. This has resulted in good characteristics. Fore example, with this first embodiment, a blocking voltage of 600 V or higher was produced with a gate reverse bias of 15 V and the on-state resistance was 1 mΩ·cm².

Figure 4:
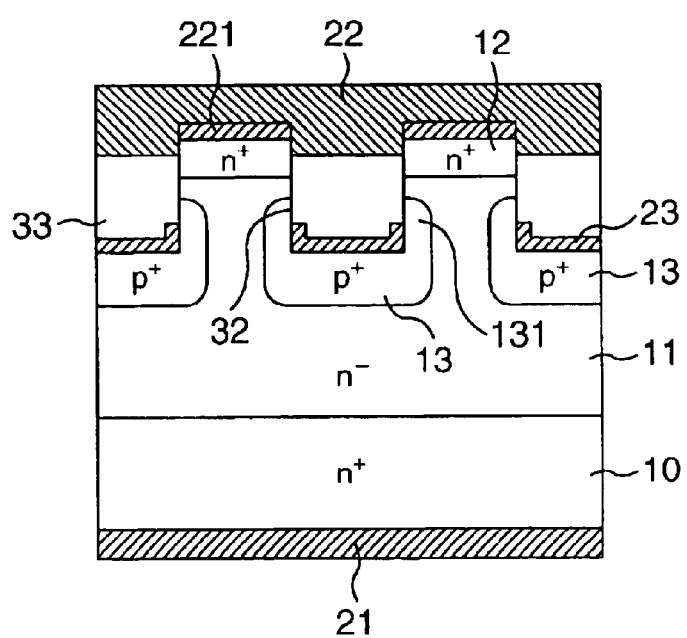
FIG. 4 is a cross-sectional view showing a structure of an SIT as a second embodiment of the present invention.

FIG. 4 is a cross-sectional view showing a structure of an SIT as a second embodiment of the present invention. In this embodiment, by applying an inclined ion implantation method in forming the p-type gate region 13, a sidewall of the trench 32 was also formed with a p-type gate region 131. As a result, good characteristics were produced with this second embodiment, such as a 600 V or higher blocking voltage obtained with a gate reverse bias of 10 V and 1.2 mΩ·cm² on-state resistance.

Figure 5:
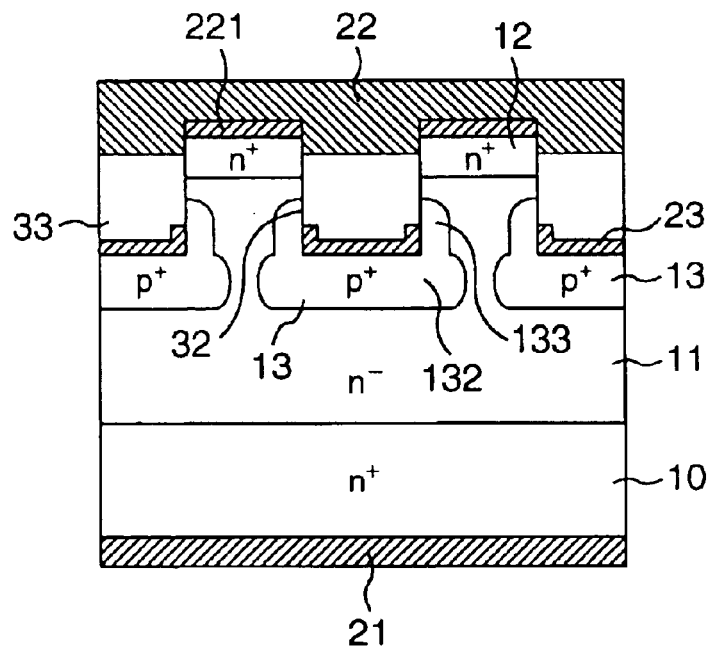
FIG. 5 is a cross-sectional view showing a structure of an SIT as a third embodiment of the present invention.

FIG. 5 is a cross-sectional view showing a structure of an SIT as a third embodiment of the present invention. In this embodiment, the inclined ion implantation on the sidewall of the trench 32 in the second embodiment is performed with a reduced energy lower than 300 keV. This enables the width of the p-type gate region 13 to be formed to be narrower on a source side 133 than on a drain side 132. As a result, good characteristics were produced with this third embodiment, such as a 600 V or higher blocking voltage obtained with a gate reverse bias of 5 V and 1.5 mΩ·cm² on-state resistance.

Figure 6:
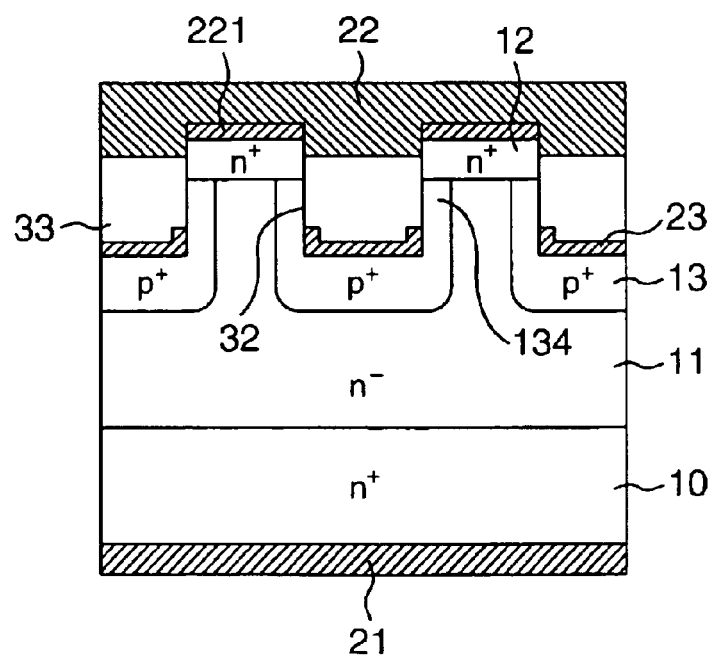
FIG. 6 is a cross-sectional view showing a structure of an SIT as a fourth embodiment of the present invention.

FIG. 6 is a cross-sectional view showing a structure of an SIT as a fourth embodiment of the present invention. In this embodiment, a p-type gate region 134, similar to the region 131 formed in the second embodiment in the sidewall of the trench 32, as shown in FIG. 4, was formed in contact with the $n^+$ source region 12. This is because the high dielectric breakdown field of SiC makes it possible to secure a sufficient blocking voltage even with a highly concentrated p-n junction. As a result, it was possible to elongate the channel length that can be controlled by the gate voltage, producing good characteristics. That is, a 600 V or higher blocking voltage was obtained with a gate reverse bias of 2.5 V and the on-state resistance was 1.7 mΩ·cm².

Figure 7:
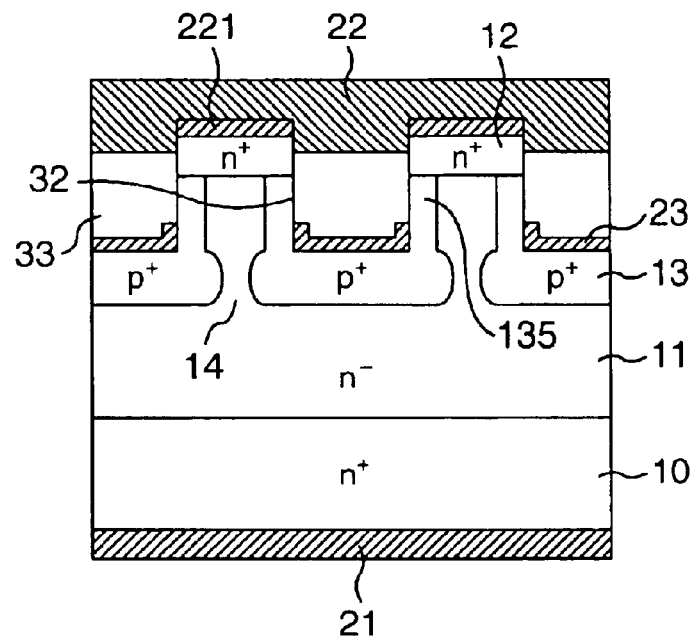
FIG. 7 is a cross-sectional view showing a structure of an SIT as a fifth embodiment of the present invention.

FIG. 7 is a cross-sectional view showing a structure of an SIT as a fifth embodiment of the present invention. In this embodiment, in addition to the third embodiment of FIG. 5, the p-type gate region 135 in the sidewall of the trench 32 was formed in contact with the $n^+$ source region 12. This allows the length of the channel 14 that can be controlled by the gate voltage to be increased, producing a 600 V or higher blocking voltage without a gate reverse bias. The on-state resistance was 2 mΩ·cm².

Figure 8:
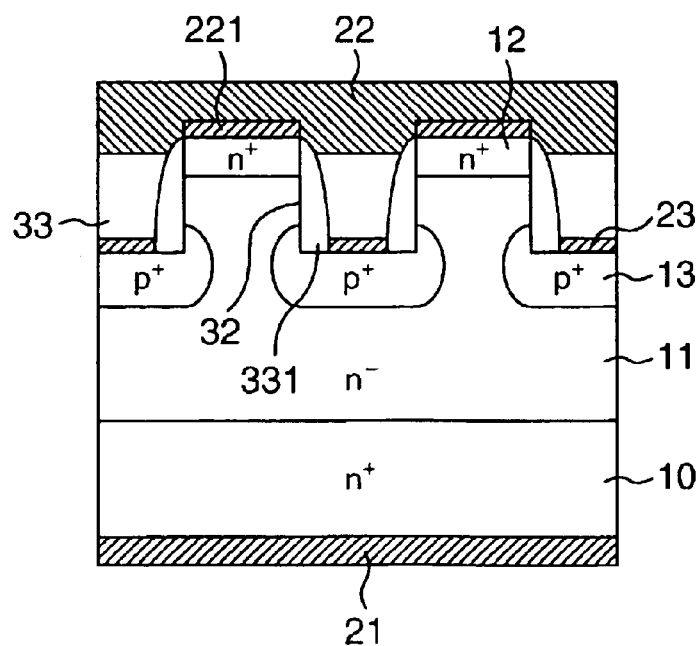
FIG. 8 is a cross-sectional view showing a structure of an SIT as a sixth embodiment of the present invention.

FIG. 8 is a cross-sectional view showing a structure of an SIT as a sixth embodiment of the present invention. In this embodiment, the sidewall of the trench 32 of the first embodiment of FIG. 1 was oxidized to form a sidewall 331 of insulating film. In this embodiment also, good characteristics similar to those of the first embodiment of FIG. 1 were obtained.

Figure 9:
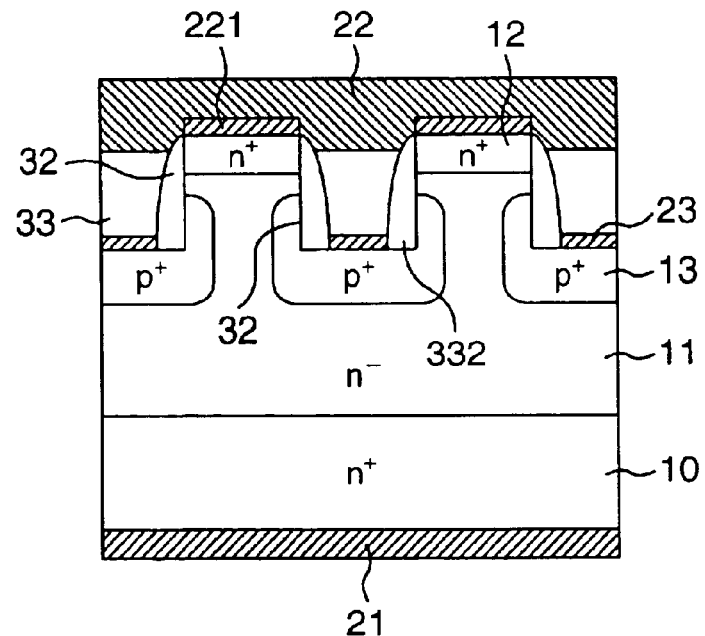
FIG. 9 is a cross-sectional view showing a structure of an SIT as a seventh embodiment of the present invention.

FIG. 9 is a cross-sectional view showing a structure of an SIT as a seventh embodiment of the present invention. In this embodiment, the sidewall of the trench 32 of the second embodiment of FIG. 4 was oxidized to form a sidewall 332 of insulating film. In this embodiment also, good characteristics similar to those of the second embodiment of FIG. 4 were obtained.

Figure 10:
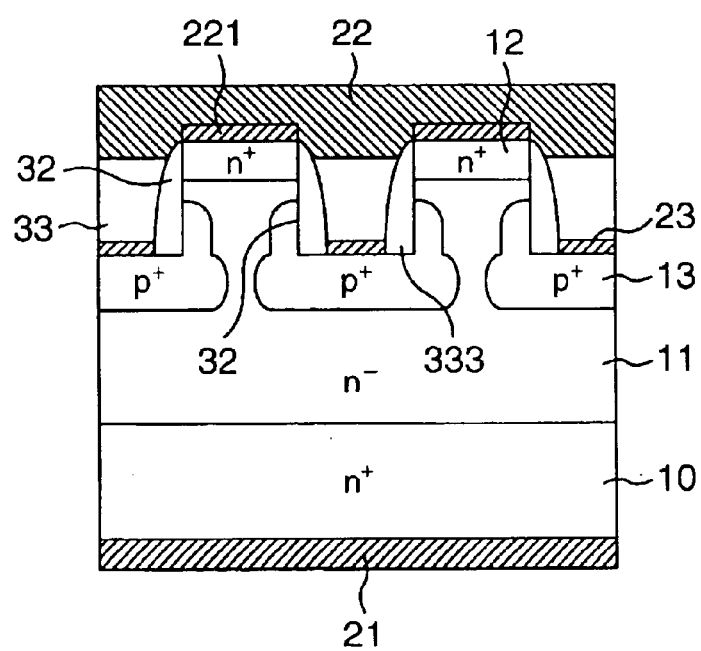
FIG. 10 is a cross-sectional view showing a structure of an SIT as an eighth embodiment of the present invention.

FIG. 10 is a cross-sectional view showing a structure of an SIT as an eighth embodiment of the present invention. In this embodiment, the sidewall of the trench 32 of the third embodiment of FIG. 5 was oxidized to form a sidewall 333 of insulating film. In this embodiment also, good characteristics similar to those of the third embodiment of FIG. 5 were obtained.

Figure 11:
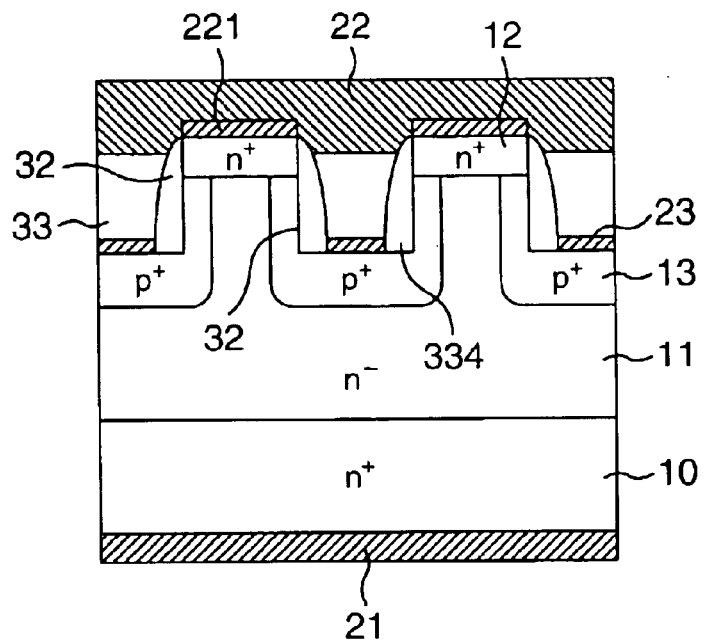
FIG. 11 is a cross-sectional view showing a structure of an SIT as a ninth embodiment of the present invention.

FIG. 11 is a cross-sectional view showing a structure of an SIT as a ninth embodiment of the present invention. In this embodiment, the sidewall of the trench 32 of the fourth embodiment of FIG. 6 was oxidized to form a sidewall 334 of insulating film. In this embodiment also, good characteristics similar to those of the sixth embodiment were obtained.

Figure 12:
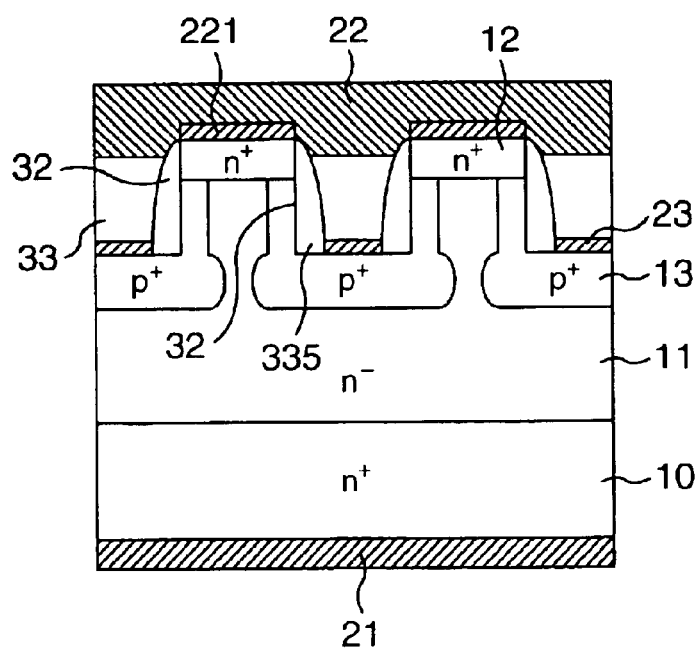
FIG. 12 is a cross-sectional view showing a structure of an SIT as a tenth embodiment of the present invention.

FIG. 12 is a cross-sectional view showing a structure of an SIT as a tenth embodiment of the present invention. In this embodiment, the sidewall of the trench 32 of the fifth embodiment of FIG. 7 was oxidized to form a sidewall 335 of insulating film. In this embodiment also, good characteristics similar to those of the seventh embodiment were obtained.

Figure 13:
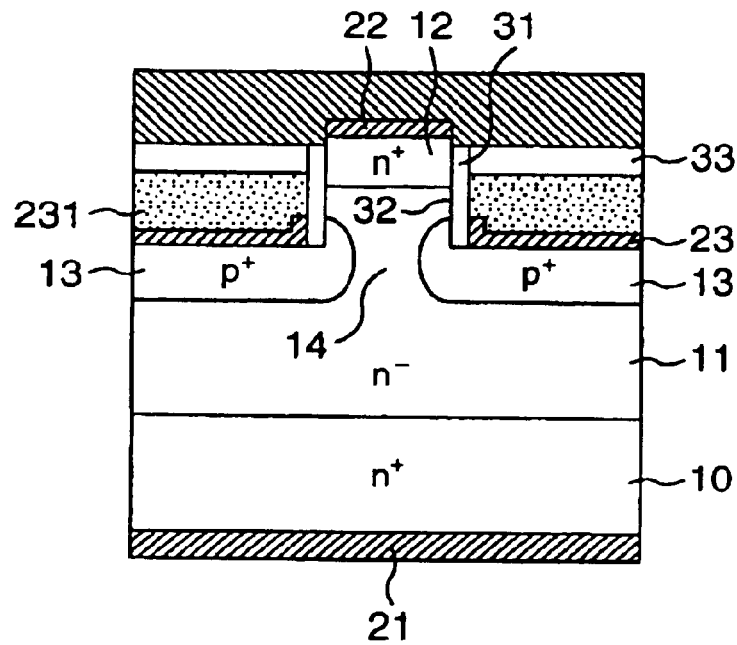
FIG. 13 is a cross-sectional view showing a structure of an SIT as an eleventh embodiment of the present invention.

FIG. 13 is a cross-sectional view showing a structure of an SIT as an eleventh embodiment of the present invention. In this embodiment, in addition to the first embodiment of FIG. 1, the sidewall of the channel 14 in contact with the sidewall of the trench 32 was formed as a MOS channel. In the figure, numeral 31 denotes a gate insulating film, and numeral 231 denotes a MOSFET gate formed of a low-resistance polysilicon or metal such as aluminum. In this embodiment, of the channel region 14 between the control regions 13, the sidewall portion adjoining the sidewall of the trench 32 is formed as a MOS channel. The provision of the MOSFET in the channel 14 improves the off-state characteristic as well as the normal SIT operations. At the same time, a positive voltage is applied to the gate during the on-state to form a conductive MOS channel in the sidewall of the trench 32 to improve the on-state characteristic. As a result, good characteristics were produced. That is, a 600 V or higher blocking voltage was obtained without a gate reverse bias. The on-state resistance was 1.7 mΩ·cm².

Figure 14:
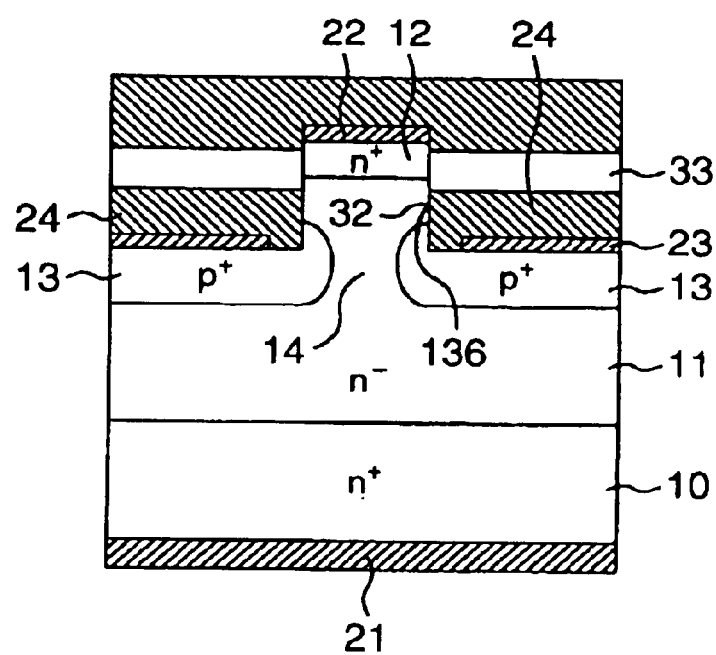
FIG. 14 is a cross-sectional view showing a structure of an SIT as a twelfth embodiment of the present invention.

FIG. 14 is a cross-sectional view showing a structure of an SIT as a twelfth embodiment of the present invention. In this embodiment, in addition to the first embodiment of FIG. 1, the sidewall of the channel 14 was formed with a MESFET. In the figure, numeral 24 denotes a Schottky gate of the MESFET. Thus, the control region 136 adjoining the sidewall portion of the trench 32 forms a Schottky contact at the sidewall portion. In this embodiment, the provision of the MESFET in the channel 14 can improve the off-state characteristics as well as the normal SIT operations. At the same time, a positive voltage is applied to the gate during the on-state to form a conductive channel in the sidewall of the trench 32 to improve the on-state characteristic. With this construction, good characteristics were produced. That is, a 600 V or higher blocking voltage was obtained without a gate reversed bias, and the on-state resistance was 1.5 mΩ·cm².

Since the above embodiments can realize a low gate reversed bias and a low on-state resistance, there are advantages, when they are applied to inverter switching devices, that the gate driving becomes easy and loss can be reduced. Also, even though the ion implantation is carried out with a relatively low energy, this invention can realize a semiconductor device with a reduced on-state resistance and an improved blocking effect.

It should be further understood by those skilled in the art that although the foregoing description has been made of various embodiments of the invention, the invention is not limited thereto, and various changes and modifications may be made without departing from the spirit of the invention and the scope of the appended claims.

What is claimed is:

1. A semiconductor device including:
   a first conductivity type substrate comprised of a semiconductor having a band gap equal to or greater than 2.0 eV and having a low impurity concentration;
   a first region formed in a first plane of the substrate and having the same first conductivity type as that of the substrate and having a resistance lower than that of the substrate;
   a first electrode formed in another plane of the first region;
   a second region formed in a second plane of the substrate and having said first conductivity type of that of the substrate; and
   a second electrode formed on the second region, the semiconductor device comprising:
   a trench formed in the second plane;
   a control region formed from a bottom of the trench into the substrate and having a different conductivity type than that of the substrate; and
   a control electrode formed on the control region,
   wherein the second electrode is formed over the control electrode through an insulating film, and
   wherein the control region having the different conductivity type from that of the substrate is formed on at least a part of sidewalls of the trench such that the control region is contacted with the second region.

2. The semiconductor device according to claim 1, wherein an insulating film is formed between the sidewall and the control region.

3. The semiconductor device according to claim 1, wherein a width of the control region is made narrower on the second region side than on the first region side.

4. The semiconductor device according to claim 1, wherein a plurality of trenches are provided, each having a corresponding control region, and
   wherein channel regions are respectively formed between adjacent ones of the control regions.

5. A semiconductor device according to claim 4, wherein sidewall portions adjoining the sidewall adjacent ones of the control regions of the trenches are comprised of MOS channels.

6. The semiconductor device according to claim 4, wherein the channel regions are narrower between areas of the control region adjacent the bottom of the trenches than between areas of the control regions adjacent to the second regions.

7. The semiconductor device according to claim 1,
wherein the control region in contact with the sidewall of the trench is formed with a Schottky contact to provide a MESFET.

8. The semiconductor device according to claim 1,
wherein the second electrode is formed over an entire surface of the unit device.

9. The semiconductor device according to claim 8,
wherein a plurality of trenches and a plurality of gate regions are provided and
wherein a narrowest portion of a channel region present under the source region and wedged between the gate regions is located deeper than bottom portions of the trenches.

10. The semiconductor device according to claim 9,
wherein the narrowest portion of the channel region is formed at a depth deeper than one half of the junction depth formed between the gate regions and the substrate.

11. The semiconductor device according to claim 1,
wherein a plurality of trenches and a plurality of control regions are provided, and
wherein a narrowest portion of a channel region present under the second region and wedged between the control regions is located deeper than bottom portions of the trenches.

12. The semiconductor device according to claim 11,
wherein the narrowest part of the channel region is formed at a depth deeper than one half of a junction depth formed between the control region and the substrate.

13. The semiconductor device according to claim 1,
wherein said control region extends from the bottom of the trench to the second region to completely cover the sidewalls of the trench.

14. A semiconductor device including:
an n-type drift region with a low impurity concentration and a band gap of 2.0 eV or higher;
an n-type drain region formed in a first plane of the drift region and having a lower resistance than the drift region;
a drain electrode formed in another plane of the drain region;
an n-type source region formed in a second plane of the region;
the semiconductor device comprising:
a trench formed in the second plane of the drift region;
a p-type gate region formed from a bottom of the trench into the drift region;
a gate electrode formed in the gate region,
wherein the source electrode is formed over the gate electrode through an insulating film, and
wherein the p-type gate region is formed on at least a part of sidewalls of the trench such that the p-type gate is contacted with the source region.

15. The semiconductor device according to claim 14,
wherein said p-type gate region extends from the bottom of the trench to the second region to completely cover the sidewalls of the trench.

16. The semiconductor device according to claim 15,
wherein the channel regions are narrowest at depth deeper than one half the junction depths formed between the second regions and the substrate.

* * * * *